United States Patent [19]

Kirschenman

[11] Patent Number: 4,516,318

[45] Date of Patent: May 14, 1985

[54] METHODS OF PROCESSING SUBSTRATES

[75] Inventor: Duane L. Kirschenman, Winston-Salem, N.C.

[73] Assignee: AT&T Technologies, Inc., New York, N.Y.

[21] Appl. No.: 488,856

[22] Filed: Apr. 26, 1983

[51] Int. Cl.³ .............................................. H05K 3/10
[52] U.S. Cl. ....................................... 29/846; 29/760; 198/345; 269/51; 269/903; 408/1 R; 409/218; 409/220
[58] Field of Search ................. 29/825, 739, 760, 721, 29/759, 558, 559; 198/345; 269/47, 73, 50, 51, 903; 408/1, 44; 409/218, 220

[56] References Cited

U.S. PATENT DOCUMENTS

| | | | |
|---|---|---|---|
| 2,959,848 | 11/1980 | Savitt | 29/721 |
| 4,255,077 | 3/1981 | Smith | 198/345 X |
| 4,291,867 | 9/1981 | Williams et al. | 29/760 X |
| 4,372,046 | 2/1983 | Suzuki | 29/413 |
| 4,399,988 | 8/1983 | De Shong | 29/739 X |

OTHER PUBLICATIONS

*Circuit World*, vol. 4, No. 1, Oct. 1977, pp. 46–52, The Implications of Automated Assembly by R. B. Smith.

Primary Examiner—Howard N. Goldberg
Assistant Examiner—Carl J. Arbes
Attorney, Agent, or Firm—D. D. Bosben

[57] ABSTRACT

A pair of spaced holes (32 and 34) are drilled in a substrate blank (10) diametrically along a line (14) defining a future locating edge (22) of a printed circuit board (12). When the substrate blank (10) is then sheared to form the printed circuit board (12), semi-circular recesses (38 and 40) are formed from the spaced holes (32 and 34) in the resultant board locating edge (22). The printed circuit board (12) then is accurately aligned in a processing station in X- and Y-directions by seating board-locating pins (50 and 52) of special configurations in respective ones of the semi-circular recesses (38 and 40).

5 Claims, 5 Drawing Figures

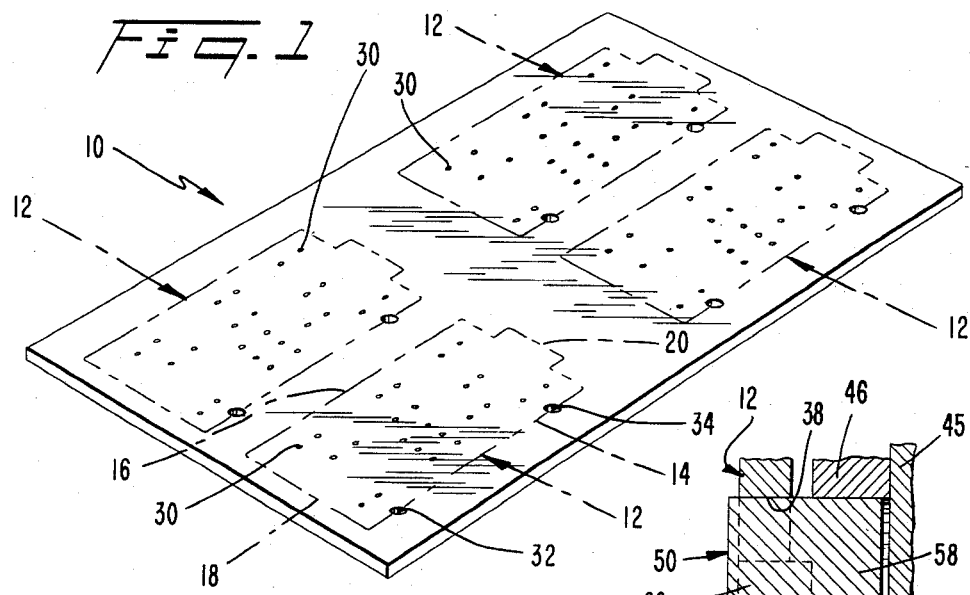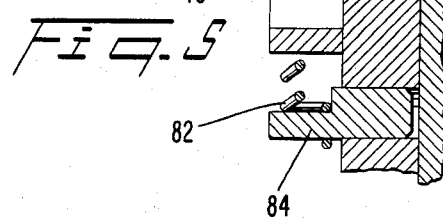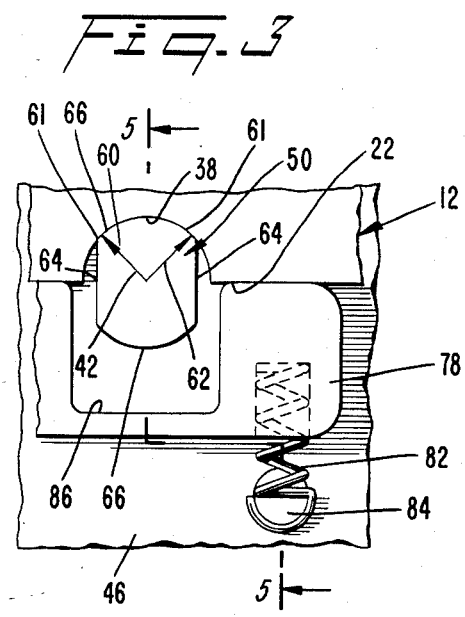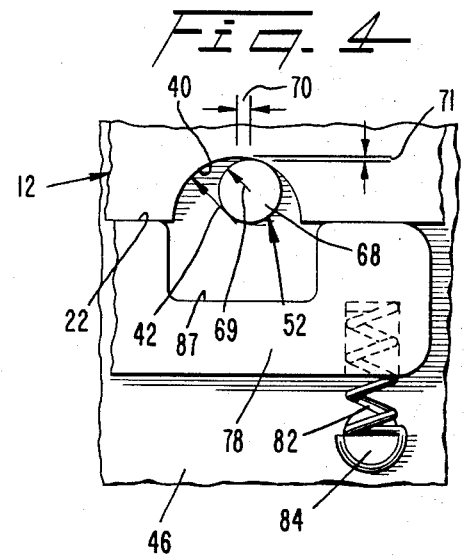

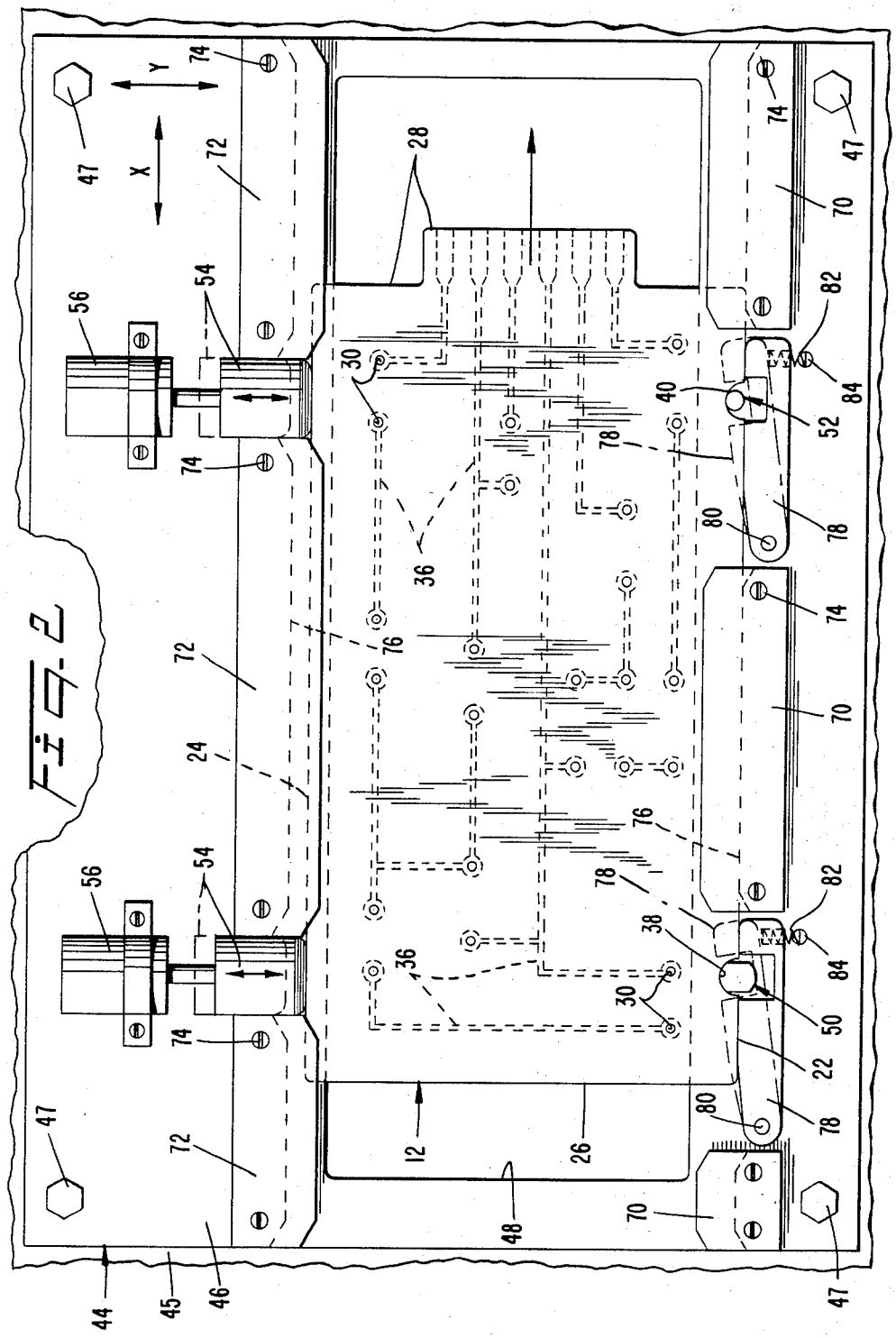

METHODS OF PROCESSING SUBSTRATES

TECHNICAL FIELD

This invention relates to methods of processing substrates, and more particularly to methods of accurately locating substrates in associated processing apparatus.

BACKGROUND OF THE INVENTION

In various stages in the manufacture of substrates, such as printed circuit boards, it is necessary to locate each substrate in a processing apparatus to a high degree of accuracy. For example, in the assembling of electronic components having projecting leads to a printed circuit board, by inserting leads of the components through preformed apertures in the board, the board generally is positioned on an X-Y support table in an automatic component-insertion apparatus. The X-Y support table then is indexed to present successive sets of lead-receiving apertures in the board beneath an insertion head for the automatic insertion of the component leads into apertures of the board. With the advent of miniaturized electronic components and high density circuit patterns on printed circuit boards, it is essential that each printed circuit board be located on the X-Y support table of the component-insertion apparatus so as to be aligned with respect to a component-insertion head to on the order of within ±0.005 inch. It also is desirable that the board alignment arrangement utilized be readily compatible with the automatic feeding of the boards into the component-insertion apparatus and the subsequent automatic discharge of the boards from the apparatus.

A known method of locating the printed circuit boards in the component insertion apparatus involves forming locating holes in the printed circuit boards by drilling or punching holes in a substrate blank from which a plurality of the boards are formed. Subsequently, each board is positioned in the component-insertion apparatus and locating dowels are advanced through the locating holes in the board to align the board with respect to the component-insertion head. Where the boards are to be fed into the component-insertion apparatus automatically, this normally requires that the locating dowels be retracted for the feeding of one of the boards into the apparatus into an approximate desired location in the apparatus. The locating dowels then are advanced through the locating holes in the board to align the board with respect to the component-insertion head. A disadvantage of this arrangement is that dowel-carrying arms and a mechanism for advancing and retracting the dowels may interfere with the insertion of certain components into the board, requiring that these components subsequently be inserted by hand.

Accordingly, another method of locating the printed circuit boards in the component-insertion apparatus involves the use of locating members which are receivable in locating recesses formed in one or more edges of each printed circuit board by punching. For example, a known technique utilizes a V-shaped locating member or a circular dowel receivable in a locating recess in the shape of a V-shaped notch in one edge of the printed circuit board, to locate the board in X and Y directions. Since punching can be inaccurate to on the order of ±0.015 inch, however, a second locating recess which receives another locating member, such as a second circular dowel, for locating the board in the Y direction, is provided in the one edge of the board in the shape of an elongated slot to compensate for the recess-forming tolerance error in the X-direction.

Another known printed circuit board edge-locating method utilizes punch-formed V-shaped notches at opposite ends of each printed circuit board. In use, the board is positioned in a processing apparatus so that one of the V-shaped notches receives a fixed locating pin. A retractable locating pin then is advanced by an air cylinder into the other V-shaped notch to align the printed circuit board in the apparatus.

In a similar locating method, the locating members are spring-loaded and of a V-shaped configuration. In addition, a third spring-loaded V-shaped locating member is receivable in a third V-shaped notch in a side edge of the printed circuit board intermediate its opposite ends. The use of circular dowels on a conveyor, which are receivable in respective ones of a pair of V-shaped notches in one end of a printed circuit board, for aligning the circuit board as the board is fed to a processing apparatus, also is known.

Since the above-described edge-locating arrangements utilize V-shaped edge-locating recesses formed by the relatively inaccurate process of punching, these arrangements are not particularly suited for the assembling of miniaturized components on high circuit density printed circuit boards, in which extremely accurate board alignment is required. Further, for various reasons, these arrangements are not readily adaptable to the automatic feeding of the printed circuit boards into and out of a processing apparatus. Accordingly, a primary purpose of this invention is to provide new and improved methods of accurately locating substrates, such as printed circuit boards, in associated processing apparatus.

SUMMARY OF THE INVENTION

In accordance with one aspect of the invention, in aligning a substrate having first and second spaced locating recesses formed in one edge of the substrate which is to extend in a first direction, a first size substrate-locating member is seated in the first locating recess so as to engage the substrate in the first locating recess at spaced points on opposite sides of the center of the recess. Thus, the first substrate locating member locates the substrate in the first direction and locates an adjacent first portion of the substrate in a second direction perpendicular to the first direction. The first substrate-locating member also seats in the first locating recess such that the substrate can pivot about the first substrate-locating member. Further, a second smaller size substrate-locating member is seated in the second locating recess such that the second locating member engages the substrate in the second locating recess adjacent the center of the recess and in spaced relationship to opposite sides of the recess to further locate an adjacent second portion of the substrate in the second direction. More specifically, the locating recesses are semicircular and have equal radii, while the portions of the locating members which seat in the locating recesses have essentially circular configurations of different radii.

In another aspect of the invention, locating recesses are formed in a substrate by forming first and second spaced circular holes in a substrate blank such that portions of the holes lie on respective opposite sides of a defined line along which the substrate blank is to be cut to form an edge of the substrate. The substrate blank then is cut along the line to form the edge of the substrate and such that portions of the circular holes define arcuate first and second locating recesses in the edge of the substrate. More specifically, the first and second circular holes are formed in the substrate blank to the same diameter and diametrically along the edge-defining line such that the resultant locating recesses are of a semi-circular configuration.

BRIEF DESCRIPTION OF THE DRAWING

FIG. 1 is an isometric view of a substrate blank from which a plurality of printed circuit boards are formed for practicing the invention;

FIG. 2 is a plan view of a printed circuit board holder for practicing the invention;

FIGS. 3 and 4 are enlarged plan views of respective portions of a printed circuit board and of the printed circuit board holder as shown in FIG. 2, illustrating aspects of the invention; and FIG. 5 is a cross-sectional view taken along the line 5—5 in FIG. 3.

DETAILED DESCRIPTION

FIG. 1 illustrates a copper-laminated substrate blank 10 from which a plurality of smaller substrates, such as printed circuit boards 12 (one shown in FIG. 2), are formed for practicing the invention. The printed circuit boards 12 are formed by cutting the substrate blank 10 along edge-defining lines 14, 16, 18 and 20 in a shearing or routing mechanism (not shown) in a known manner to form a board-locating side edge 22 (FIG. 2), an opposite side edge 24 (FIG. 2) and opposite end edges 26 and 28 (FIG. 2), respectively, on each of the boards.

In forming the printed circuit boards 12 from the substrate blank 10, the substrate blank is mounted in a numerically controlled drilling machine (not shown) and lead-receiving apertures 30 are drilled through the substrate in a predetermined pattern within the board edge-defining lines 14, 16, 18 and 20 in a known manner. For example, a machine suitable for this purpose is the Direct Numerically Controlled (DNC) drilling machine Model "Tru Drill 95" available from the Advanced Controls Corporation of Irving, Calif.

In accordance with this invention, sets of first and second spaced circular holes 32 and 34, respectively, of equal diameters also are accurately formed in the substrate blank 10. For example, suitable accuracy in the forming of the circular holes 32 and 34 has been achieved by drilling the holes in the substrate blank 10 in conjunction with the drilling of the lead-receiving apertures 30 in the substrate blank in the above-mentioned drilling machine. More specifically, each set of the first and second circular holes 32 and 34, respectively, is drilled in the substrate blank 10 essentially diametrically along a respective one of the locating edge-defining lines 14 which defines the board-locating edge 22 of the associated printed circuit board 12, such that portions of the circular holes lie on respective opposite sides of the line. Printed circuits 36 (one shown on the board 12 in FIG. 2) next are formed on portions of the substrate blank 10 within the board edge-defining lines 14, 16, 18 and 20 in a known manner. The substrate blank 10 then is sheared or routed along the board edge-defining lines 14, 16, 18 and 20 to produce the printed circuit boards 12, with the separation across each of the locating edge-defining lines 14 causing first and second arcuate semi-circular locating recesses 38 (FIGS. 2 and 3) and 40 (FIGS. 2 and 4), respectively, each having a radius 42 (FIGS. 3 and 4), to be formed in the board-locating edge 22 of each of the printed circuit boards.

Referring to FIG. 2, each of the printed circuit boards 12 then is positioned in a printed circuit board holder 44 of special construction mounted on an X-carriage 45 of an X-Y traversing mechanism of an automatic component insertion machine, such as the Model 6341 component insertion machine available from the Universal Instruments Corporation of Binghamton, N.Y., the remainder of which is not shown. The printed circuit boards 12 may be positioned in the board holder 44 manually, or automatically from a vertical magazine (not shown) by a suitable feed mechanism (not shown). The board holder 44 includes a base plate 46 in the form of a rectangular frame secured to the X-carriage 45 by screws 47 and having a central rectangular opening 48 formed therein.

In accordance with this invention, referring to FIGS. 2 and 3, the printed circuit board 12 is accurately located on the board holder 44 in first and second directions perpendicular to one another and hereinafter designated an X-direction (horizontally in FIGS. 2, 3 and 4) and a Y-direction (vertically in FIGS. 2, 3 and 4), respectively. More specifically, the printed circuit board 12 is located in a component-receiving position as shown in FIG. 2, by a first size board-locating pin 50 receivable in the arcuate first locating edge recess 38, and a second smaller size board-locating pin 52 receivable in the arcuate second locating edge recess 40. For this purpose, the board-locating pins 50 and 52 are of precise construction and are precisely located in the holder base plate 46 so as to project upwardly therefrom, as shown in FIG. 5 by the first board-locating pin 50. The printed circuit board 12 is urged into engagement with the board-locating pins 50 and 52 by a pair of pusher blocks 54 engageable with the edge 24 of the board and mounted on piston rods of air cylinders 56 suitably mounted on the base plate 46. The pusher blocks 54 are movable by the air cylinders 56 between solid-line clamping positions as shown in FIG. 2 and broken-line retracted positions as shown in FIG. 2.

More specifically, referring to FIGS. 3 and 5, the first board-locating pin 50 includes a lower mounting portion 58 (FIG. 5) press-fitted into an aperture in the holder base plate 46, and an upwardly projecting board-locating portion 60. In accordance with this invention, the board-locating portion 60 of the pin 50 is of a construction such that at least two locating portions 61 (FIG. 3) of the board-locating portion seat firmly against the wall of the recess 38 on opposite sides of a centerline of the recess in mating relationship with the recess. For example, as is best shown in FIG. 3, the pin 50 may be formed from a cylindrical member which has an initial radius 62 identical to the radius 42 of the first locating edge recess 38 of the printed circuit board 12, by machining the pin to produce two flat surfaces 64 on opposite first sides of the pin and two peripheral circular arc portions 66, which include the locating portions 61, on opposite second sides of the pin. The forming of the flat surfaces 64 on the board-locating portion 60 of the pin 50 is desirable from the standpoint of facilitating reception of the board-locating portion into the first locating edge recess 38 of the printed circuit board 12 and proper seating of the adjacent circular arc portion 66 of the board-locating portion in the recess.

In this connection, forming of the flat sides 64 on the board-locating portion 60 of the pin 50 facilitates reception of the board-locating portion in the first locating edge recess 38 as a result of the board-locating portion being narrower than the recess. Further, when the board-locating portion 60 of the pin 50 and a wall of the first locating edge recess 38 of the printed circuit board 12 are engaged with one another as shown in FIGS. 2 and 3, the adjacent circular arc portion 66 seats firmly against the wall of the recess in mating relationship therewith to locate the board in the X-direction (horizontally in FIG. 2), and to locate an adjacent left-hand portion of the board, as viewed in FIG. 2, in the Y-direction (vertically in FIG. 2). At the same time, the circular arc portion 66 and the wall of the arcuate recess 38 mate with one another so that the printed circuit board 12 can pivot about the board-locating pin 50 as an axis to permit firm engagement of the second board-locating pin 52 and a wall of the second locating edge recess 40 to locate an adjacent right-hand portion of the board, as viewed in FIG. 2, in the Y-direction.

As disclosed in FIGS. 2 and 4, the second board-locating pin 52 is of cylindrical construction, having a lower portion (not shown) press-fitted into an aperture in the base plate 46 and having an upper board-locating portion 68 of circular cross-section. To compensate for tolerance errors in the forming of the first and second locating edge recesses 38 and 40 in the printed circuit board 12 in the X-direction, a radius 69 (FIG. 4) of the upper board-locating portion 68 of the pin 52 is smaller than the radius 42 of the second locating edge recess 40 in which the pin is received so that the pin is received in the recess in spaced relationship to opposite sides of the recess.

Further, to minimize location errors in the Y-direction the second board-locating pin 52 is mounted in the base plate 46 in a position such that under optimum conditions, namely, zero error in the respective locations of the first and second locating edge recesses 38 and 40 in the X-direction, the board-locating portion 68 of the pin will seat in the second recess 40 exactly in the center of the recess. In this regard, referring to FIG. 4, an error in the location of the second locating edge recess 40 with respect to the first locating edge recess 38 in the X-direction will cause the upper board-locating portion 68 of the pin 52 to seat slightly off-center in the second recess by an amount 70 as shown in this figure. However, since the second locating edge recess 40 is semicircular and thus essentially flat at its center, the amount of error 71 in the locating of the printed circuit board 12 in the Y-direction is only a fraction of the error in the X-direction. For example, with the second locating edge recess 40 and the board-locating portion 68 of the second pin 52 having radii of 0.062 inch and 0.047 inch, respectively, by mathematical computation a location error 70 of the second recess in the X-direction of 0.005 inch produces a location error 71 in the Y-direction of only 0.001 inch.

Referring to FIG. 2, each printed circuit board 12 is fed into a position on the board holder 44 with the locating edge 22 of the board disposed in a set of first guide tracks 70 and the opposite edge 24 of the board disposed in a set of second guide tracks 72. Each of the guide tracks 70 and 72 may be formed by vertically stacked upper, lower and intermediate flat plates secured to the base plate 46 by screws 74, with the intermediate plate recessed with respect to the upper and lower plates to define a guide groove 76.

Prior to the positioning of each of the printed circuit boards 12 in the board holder 44, the air cylinders 56 are operated to move the pusher blocks 54 to their broken-line retracted positions as shown in FIG. 2. As the printed circuit board 12 then is fed into the guide tracks 70 and 72, the locating edge 22 of the board engages a pair of biasing arms 78 which are disposed in openings between the first guide tracks 70, and which are movable between broken-line and solid-line positions as shown in FIG. 2. The biasing arms 78 urge the printed circuit board 12 toward the second guide tracks 72 to preclude the locating edge 22 of the board from engaging and riding on the board-locating pins 50 and 52 so as to cause wear on the pins as the board is advanced through the guide tracks 70 and 72.

Each of the biasing arms 78 is pivotally mounted at one end on the base plate 46 by a pivot pin 80 and may be urged into the broken-line position in FIG. 2 in a suitable manner, such as by a coil spring 82. Each coil spring 82 is mounted at one end in a recess in the biasing arm 78 and is secured at its opposite end to an upper semi-circular portion of a dowel 84 press-fitted into the base plate 46 (see FIG. 5). Each biasing arm 78 also includes a cutout portion 86 (FIG. 3) or 87 (FIG. 4) which receives the adjacent locating pin 50 or 52, respectively, when the biasing arm is moved into its broken-line position, with the adjacent pin functioning as a stop to limit movement of the arm.

The printed circuit board 12 is fed along the guide tracks 70 and 72 until the first and second locating edge recesses 38 and 40 are in general alignment with the first and second board-locating pins 50 and 52, respectively. This general alignment may be accomplished visually when the board 12 is being fed along the guide tracks 70 and 72 manually, or by controlling the feed stroke of the above-mentioned feed mechanism (not shown) in a known manner when the boards are fed into the guide tracks automatically. The air cylinders 56 then are actuated so that the pusher blocks 54 push the printed circuit board 12 against the action of the biasing arms 78 and toward the board-locating pins 50 and 52, whereby the pins are received in their respective locating edge recesses 38 and 40 of the board as shown in FIGS. 2, 3 and 4, to locate the board in the X- and Y-directions and into the component-receiving position on the board holder 44 as above described.

After the printed circuit board 12 has been located and clamped in the component receiving position on the board holder 44 by the air cylinders 56 as shown in FIG. 2, the board holder is traversed by the X-Y carriage mechanism of the above-mentioned component-insertion machine (not shown) for the automatic insertion of components (not shown) into the board. After insertion of the components has been completed, the air cylinders 56 are de-energized and the biasing arms 78 move the printed circuit board 12 back toward the second guide tracks 72 and out of engagement with the board-locating pins 50 and 52. As viewed in FIG. 2, the printed circuit board 12 then may be fed to the right in the guide tracks 70 and 72 for removal from the board holder 44, by the feeding of a next printed circuit board (not shown) into the guide tracks for a component insertion operation. During this feeding of the printed circuit board 12, the locating edge 22 of the board again is precluded by the biasing arms 78 from engaging and causing wear of the pins 50 and 52 as noted above.

While the locating edge recesses 38 and 40 of the printed circuit board 12 have been disclosed as being semi-circular, and the board locating pins 50 and 52 have been disclosed as being of a particular construction, it is considered within the purview of the invention to utilize locating edge recesses and board-locating pins of other configurations. For example, the first locating edge recess 38 and the first board-locating pin 50 can be of other cross-sectional configurations than shown in the drawings as long as the pin 50 engages the printed circuit board 12 at spaced points on opposite sides of the center of the recess so as to locate the printed circuit board 12 in the X-direction, and as long as the pin permits pivoting of the printed circuit board about the pin as an axis. Further, the second locating edge recess 40 and the second board-locating pin 52 can be of other cross-sectional configurations than shown in the drawings as long as the pin engages the printed circuit board 12 adjacent the center of the recess and in spaced relationship to opposite sides of the recess.

In addition, while the second board-locating pin 52 is shown as fixedly mounted in the base plate 46, it is contemplated that the second board-locating pin could be adjustably mounted on the base plate to accommodate locating edge recesses 38 and 40 of different spacings and/or printed circuit boards 12 of different lengths. For example, the second board-locating pin 52, together with the associated biasing arm 78, arm biasing spring 82 and spring-backup dowel 84, could be mounted on a support block (not shown) adjustably mounted in the base plate 46 in a suitable manner.

In summary, new and improved methods of processing a substrate, such as the printed circuit board 12, have been disclosed. In this connection, initially the circular holes 32 and 34 are accurately formed by drilling in the substrate blank 10 essentially diametrically along the lines 14 defining the future locating edges 22 of the printed circuit boards 12. Thus, when the substrate blank 10 subsequently is separated along the lines 14 in the forming of the printed circuit boards 12, the locating edge of each of the resultant boards includes the locating edge 22 having the accurately formed semicircular locating recesses 38 and 40 therein. Each printed circuit board 12 then is accurately located in a processing apparatus, such as the above-mentioned component insertion machine, by engaging the board-locating pins 50 and 52 in the semi-circular locating recesses 38 and 40, respectively, as shown in FIG. 2. More specifically, the first board-locating pin 50 engages in the first locating recess 38 at at least two spaced points 61 on opposite sides of the center of the recess to locate the printed circuit board in the X-direction, and to locate the left-hand portion of the board, as viewed in FIG. 2, in the Y-direction. At the same time, the first board-locating pin 50 permits the printed circuit board 12 to pivot about the pin such that the second board-locating pin 52 seats in the second locating recess 40 with essentially point contact adjacent the center of the recess, to locate the right-hand portion of the board, as viewed in FIG. 2, in the Y-direction. In this connection, referring to FIG. 4, since the semi-circular locating edge recess 40 is essentially flat adjacent its center, any error 70 in the location of the recess in the X-direction produces a location error 71 in the Y-direction which is only a fraction of the error in the X-direction.

What is claimed is:

1. A method of precisely aligning a substrate in a preselected position in an X-Y coordinate system, wherein the substrate has first and second spaced arcuate locating recesses having the same radius formed in an edge of the substrate which is to extend in an X-direction, which comprises the steps of:

providing a first locating member which has peripherally spaced arcuate portions having a radius which is essentially the same as the radius of the arcuate locating recesses in the edge of the substrate;

providing a second locating member which has a peripheral arcuate portion having a radius which is less than the radius of the arcuate locating recesses in the edge of the substrate;

causing the first locating member to seat in the first arcuate locating recess such that the peripherally spaced arcuate portions of the first locating member engage respective portions of the substrate in the first arcuate locating recess at spaced points on respective opposite sides of a center of the arcuate recess, to locate the substrate in the X-direction, to locate an adjacent first portion of the substrate in a Y-direction which is perpendicular to the X-direction, and such that the substrate can pivot about the first locating member, and causing the second locating member to seat in the second arcuate locating recess such that the peripheral arcuate portion of the second locating member engages the substrate in the second arcuate locating recess adjacent the center of the second arcuate locating recess with adjacent portions of the second locating member in spaced relationship to opposite sides of the second arcuate locating recess, to locate an adjacent second portion of the substrate in the Y-direction such that the edge of the substrate having the arcuate locating recesses formed therein extends in the X-direction.

2. The method as recited in claim 1, in which: the locating recesses in the edge of the substrate have a semi-circular configuration.

3. A method of processing a substrate, which comprises:

defining lines on a substrate blank which correspond to respective desired edges of a substrate and along which the substrate blank subsequently can be cut to form the desired edges of the substrate;

forming first and second spaced circular holes in the substrate blank such that portions of the circular holes lie on respective opposite sides of one of the defined lines;

cutting the substrate blank along the one line to form one of the desired edges of the substrate and such that portions of the circular holes define arcuate first and second locating recesses in the one edge of the substrate;

cutting the substrate blank along the additional defined lines to form the remaining desired edges of the substrate;

providing a first locating member which has peripherally spaced arcuate portions having a radius which is essentially the same as a radius of the first arcuate locating recess in the edge of the substrate;

providing a second locating member which has a peripheral arcuate portion having a radius which is less than a radius of the second arcuate locating recess in the edge of the substrate;

locating the substrate in an X-Y coordinate system of an associated apparatus by causing the first locating member to seat in the first arcuate locating recess such that peripherally spaced arcuate surface portions of the first locating member engage the substrate at spaced points in the first arcuate locating recess on respective opposite sides of the center of the recess, to locate the substrate in both X- and Y-directions which extend perpendicular to one another, and such that the substrate can pivot about the first locating member; and aligning the substrate in the associated apparatus by causing the second locating member to seat in the second locating recess such that the peripheral arcuate portion of the second locating member engages the substrate adjacent the center of the recess with adjacent portions of the second locating member in spaced relationship to opposite sides of the second locating recess to further locate the substrate in the Y-direction.

4. The method as recited in claim 3, in which:
the circular holes are formed in the substrate blank to the same diameter such that the first and second arcuate recesses in the one edge of the substrate have the same radius.

5. The method as recited in claim 4, in which:
the circular holes are formed in the substrate blank diametrically along the one line such that the cutting of the substrate blank along the one line produces semi-circular first and second locating recesses in the edge of the substrate.

* * * * *